(12) United States Patent
Glovatsky et al.

(10) Patent No.: US 6,740,246 B2
(45) Date of Patent: May 25, 2004

(54) CIRCUIT BOARD AND A METHOD FOR MAKING THE SAME

(75) Inventors: Andrew Zachary Glovatsky, Plymouth, MI (US); Robert Edward Belke, West Bloomfield, MI (US); Marc Alan Straub, Dearborn Heights, MI (US); Michael George Todd, Anaheim Hills, CA (US)

(73) Assignee: Visteon Global Tech., Inc., Dearborn, MI (US)

( * ) Notice: Subject to any disclaimer, the term of this patent is extended or adjusted under 35 U.S.C. 154(b) by 156 days.

(21) Appl. No.: 09/836,645

(22) Filed: Apr. 17, 2001

(65) Prior Publication Data

US 2002/0148642 A1 Oct. 17, 2002

Related U.S. Application Data

(60) Provisional application No. 60/207,647, filed on May 26, 2000.

(51) Int. Cl.[7] .......................... H01B 13/00; H05K 3/00; H05K 3/02

(52) U.S. Cl. .................. 216/18; 216/15; 29/829; 29/846

(58) Field of Search .................. 216/13, 15, 17, 216/18, 19; 174/250, 261, 262, 263, 255; 29/830, 831, 832, 846, 847

(56) References Cited

U.S. PATENT DOCUMENTS

| | | | |
|---|---|---|---|
| 3,801,388 A | | 4/1974 | Akiyama et al. |
| 4,404,059 A | * | 9/1983 | Livshits et al. ............... 216/17 |
| 4,528,064 A | * | 7/1985 | Ohsawa et al. ............... 216/18 |
| H1471 H | * | 8/1995 | Braun et al. ................. 361/704 |
| 5,451,721 A | * | 9/1995 | Tsukada et al. ............. 174/261 |
| 5,738,797 A | | 4/1998 | Belke, Jr. et al. |

* cited by examiner

*Primary Examiner*—Gregory Mills
*Assistant Examiner*—Roberts Culbert
(74) *Attorney, Agent, or Firm*—Visteon Global Tech., Inc.

(57) ABSTRACT

A method for making multi-layer electronic circuit boards 64 having "blind" type apertures 28, 30 which may be selectively and electrically grounded and further having selectively formed air bridges and/or crossover circuits 45, 46.

16 Claims, 3 Drawing Sheets ern the present invention relates to a circuit board and to a method for making a circuit board and, more particularly, to a multi-layer circuit board and to a method for making a multi-layer electrical circuit board having air-bridges and/or crossover circuits and further having metallized apertures which are selectively formed through the board and which may be selectively connected and/or detached and/or isolated from an electrical ground plane.

CIRCUIT BOARD AND A METHOD FOR MAKING THE SAME

This application claims benefit of 60/207,647 filed May 26, 2000.

FIELD OF THE INVENTION

The present invention relates to a circuit board and to a method for making a circuit board and, more particularly, to a multi-layer circuit board and to a method for making a multi-layer electrical circuit board having air-bridges and/or crossover circuits and further having metallized apertures which are selectively formed through the board and which may be selectively connected and/or detached and/or isolated from an electrical ground plane.

BACKGROUND OF THE INVENTION

Multi-layer circuit boards allow electrical components to selectively and operatively populate opposed surfaces of each board (or other respective interior portions of each of the boards), thereby desirably allowing each of the electrical circuit boards to contain a relatively large amount of electrical components which efficiently and densely populate the respective boards. It is desirable to allow each of the component-containing surfaces or portions of a created and/or formed electrical circuit board to communicate and/or be selectively interconnected, thereby allowing the contained electrical components to cooperatively and selectively form one or more desired electrical circuits. This desired communication and/or interconnection typically requires the use of shared electrical ground planes, the transmittal of power and/or control type signals between each of the component containing surfaces or board portions, and/or the connection and/or interconnection of the various contained electrical components.

This desired interconnection typically requires that one or more holes be drilled through each of the circuit boards, thereby physically creating at least one "through hole" or "via" lying between each of the opposed component containing surfaces and through the various interior circuit board portions. Such drilling is undesirable since it is relatively time consuming, costly, potentially causes damage to significant numbers of the formed electrical circuit boards requiring these circuit boards to be destroyed, and requires costly and inefficient electroless and/or electrolytic plating of the formed holes or "vias".

While some attempts have been made to obviate the need for such plating, such as by the use of a conductive epoxy within each of the drilled holes, these attempts have not produced reliable electrical interconnections and these produced interconnections are not typically adapted to allow the communication of electrical power signals between the board surfaces or to securely and reliably allow the formed aperture to securely receive a component.

Further, it is desirable to form "air-bridges" or "crossover type circuits" upon one or more selected surfaces and/or within certain component containing portions of the formed circuit board in order to allow multiple levels of circuits and/or electrical interconnections to be formed upon a single board surface or within a certain component containing portion of the circuit board, thereby desirably increasing the amount of electrical circuits which may be created upon and/or within the created circuit board.

These air-bridges or crossover circuits are typically formed by rather complicated, costly, and time consuming processes which require successive layers of material to be accurately and precisely aligned by the use of rather complex and inefficient alignment processes and/or methodologies. This alignment process is both time consuming and costly, thereby limiting and/or reducing the desirability of creating these air-bridges or crossover circuits. Further, the formed bridges and crossover circuits do not typically and efficiently accommodate certain desirable circuit board interconnection processes and/or schemes such as and without limitation, the use of relatively heavy wire bonding (e.g., using aluminum wire having a diameter of about five to about twenty milli-meters) or the direct connection of components to a surface of the board.

There is therefore a need to provide a method for producing a multi-layer electrical circuit board which overcomes some or all of the previously delineated drawbacks, which selectively allows grounded and non-ground "vias" and/or "through holes" to be desirably and selectively formed, and which further allows for the efficient and selective formation of air-bridge members or crossover members which desirably accommodate diverse types of circuit interconnection processes and/or schemes.

SUMMARY OF THE INVENTION

It is a first object of the present invention to provide a method for producing a multi-layer electrical circuit board which overcomes some or all of the previously delineated drawbacks of prior multi-layer electrical circuit board forming methodologies and techniques.

It is a second object of the invention to provide a method for producing a multi-layer electrical circuit board which overcomes some or all of the previously delineated drawbacks of prior multi-layer electrical circuit board forming methodologies and techniques, which allows for the selective, efficient, and reliable formation of metalized apertures which cooperatively allow for communication by and between and/or interconnection of these various electronic components, and which allows these apertures to be selectively created and/or formed without drilling, and which allows these apertures to selectively, securely, and reliably receive a component and/or an element.

It is a third object of the invention to provide a method for producing a multi-layer electrical circuit board which overcomes some or all of the previously delineated drawbacks of prior multi-layer electrical circuit board forming methodologies and techniques and which allows for the selective formation of metalized apertures which may be selectively connected or disconnected and/or isolated from a selectively formed electrical ground plane or bus.

It is a fourth object of the invention to provide a method for producing a multi-layer electrical circuit board which overcomes some or all of the previously delineated drawbacks of prior multi-layer electrical circuit board forming methodologies and techniques and which allows for the selective and efficient formation of air bridges and/or crossover members which are adapted to accommodate a wide variety of component interconnection assemblies.

It is a fifth object of the invention to provide a method for producing a multi-layer electrical circuit board which overcomes some or all of the previously delineated drawbacks of prior multi-layer electrical circuit board forming methodologies and techniques and which allows the created circuit board to be functionally tested prior to receiving the electronic components.

It is a sixth object of the invention to provide a method for producing a multi-layer electrical circuit board which overcomes some or all of the previously delineated disadvantages of prior multi-layer electrical circuit boards and which allows the various layers of the produced circuit board to be relatively easily and desirably aligned with other layers and/or with the circuit board before they are respectively attached to these other layers and/or to the circuit board.

According to a first aspect of the present invention, a method for making an electric circuit board is provided. The method includes the steps of providing a member having a central layer of a first material which is operatively positioned between first and second layers of a second material; placing a layer of a third material upon certain portions of the first layer, thereby exposing at least one portion of the first layer; placing a plurality of layers of the second material on top of the layer of the third material, effective to form a multi-layer electrical circuit board having an aperture which extends through the formed electrical circuit board and which terminates upon the exposed at least one portion of the top layer.

According to a second aspect of the present invention a multi-layer circuit board is provided. The method includes the steps of providing a member having a central layer of a first material which is operatively positioned between top and bottom layers of a second material; removing a portion of the first and the second layers, thereby exposing portions of the central layer of the first material; providing a first layer of a dielectric material and placing the provided first layer of the dielectric material onto certain portions of the top layer, thereby overlaying the exposed portions of the central layer and creating first and second exposed portions of the top layer; providing a third layer of the second material and placing the third layer onto the first layer of the dielectric material and over the first and second exposed portions of the top layer; removing those portions of the third layer which overlay the first and the second exposed portions of the top layer; providing a second layer of the dielectric material and placing the second layer of the dielectric material onto the third layer after those portions of the third layer which overlay the first and second exposed portions of the top layer have been removed; providing a fourth layer of the second material and placing the fourth layer upon the second layer of the dielectric material and over the first and second exposed portions of the top layer; and removing those portions of the fourth layer which overlay the first and the second exposed portions of the top layer, thereby creating an electrical circuit board having a first aperture which extends through the third and fourth layers of the second material and through the first and second layers of the dielectric material while terminating within the first layer of the second material, and a second aperture which extends through the third and fourth layers of the second material and through the first and second layers of the dielectric material while terminating within the first layer of the second material.

According to a third aspect of the present invention, a circuit assembly is provided. The circuit assembly is made by the process of providing a core member having a central layer of a first material which is operatively contained between a top and a bottom layer of electrically conductive material; creating an registration slot within the core member; placing dielectric material on certain portions of the top layer, thereby exposing a first and a second portion of the top layer, thereby creating a pre-circuit assembly; and using the created registration slot to selectively add layers of electrically conductive material to the pre-circuit assembly, thereby creating a circuit assembly having a first aperture which is formed through the created circuit assembly and which terminates within the first exposed portion and having a second aperture which is formed through the created circuit assembly and which terminates within the second exposed portion.

These and other objects, aspects, and advantages of the present invention will become apparent upon reading the following detailed description in combination with the accompanying drawings.

DETAILED DESCRIPTION OF THE PREFERRED EMBODIMENT OF THE INVENTION

Figure 1A:
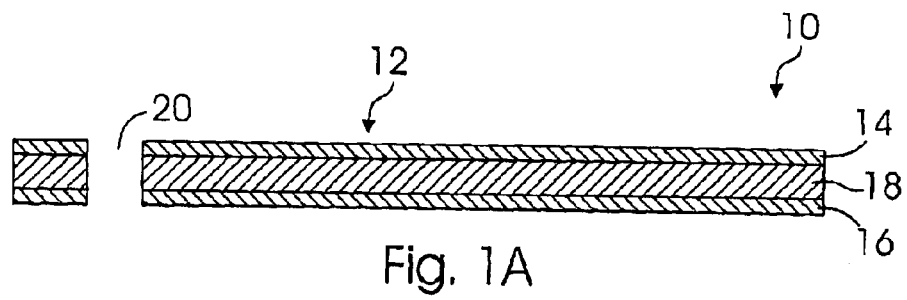
FIGS. 1(a)–(k) are successive sectional side views of a multi-layer circuit board being produced and/or formed in accordance with the teachings of the preferred embodiment of the invention.

Referring now to FIGS. 1(a)–(k), there is shown a process 10 for making a multi-layer electrical circuit board according to the teachings of the preferred embodiment of the invention. As shown best in FIG. 1(a), process 10 begins with the use and/or acquisition and/or formation of a member 12 having substantially identical first and second layers 14, 16 which are formed from substantially identical electrically conductive material. In one non-limiting embodiment of the invention, layers 14, 16 are formed from a commercially available electrically conductive metal, such as copper. Member 12 further has a central layer 18 which is positioned and/or "sandwiched" and/or operatively coupled between and to layers 14, 16 and which, in one non-limiting embodiment, comprises commercially available aluminum. Hence, in one non-limiting embodiment, member 12 comprises a double-sided copper clad aluminum member. In one non-limiting embodiment of the invention, a registration slot or aperture 20 is formed within and through member 12 and is used to relatively efficiently and easily allow successive layers of material to be operatively coupled to the member 12 in a desired alignment and/or pattern. Particularly, aperture 20 may be formed in virtually any desired shape and/or size desired by the user of the process 10 and is not limited by the exact shape or size shown in FIG. 1(a). Alignment slot 20 may be formed by known etching or other material removal processes.

Figure 1B:
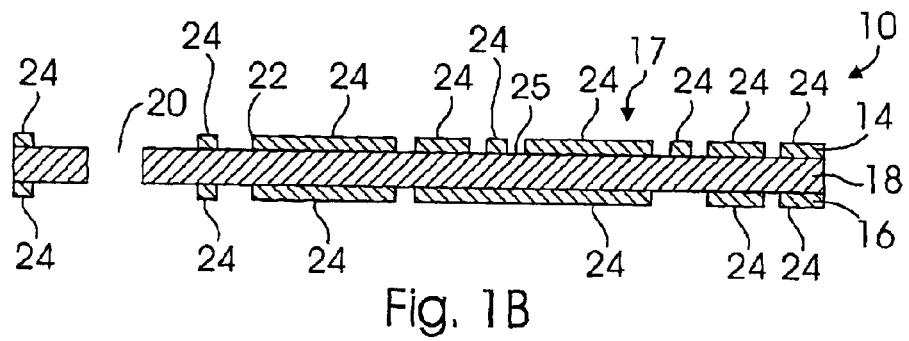

In the second step of process 10, as shown best in FIG. 1(b), pre-determined portions of the layers 14, 16 are removed by a conventional pattern etching process. In one non-limiting embodiment, the etching process utilizes a commercially available "dry film" and/or a screen printed etch resistant material to protect those portions of layers 14, 16 which are not to be removed, thereby allowing the material 14, 16 to be selectively notched in the manner shown. The remaining portions 22 of the layers 14, 16, in one non-limiting embodiment, are coated with and/or receive a layer of conventional tin 24 in order to substantially ensure that these portions 22 will not be further etched, removed, and/or reduced in the remaining steps of process 10. This etching/removal process causes certain apertures 25 to be created in layers 14, 16, thereby exposing certain portions of central or core member 18 and producing a pre-circuit assembly 17.

Figure 1C:
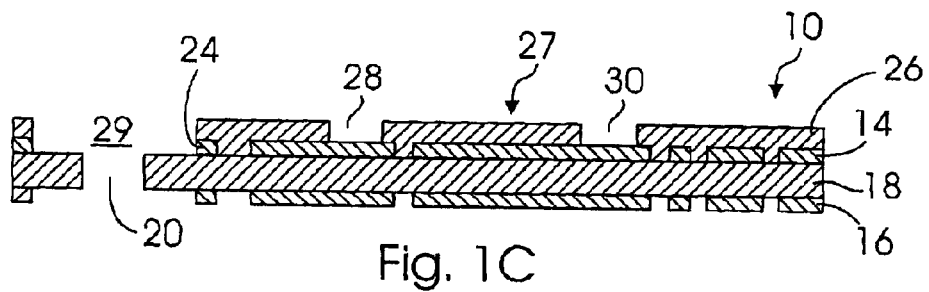

In the third step of process 10, as shown best in FIG. 1(c), a conventional and commercially available dielectric material 26 is placed upon certain portions of the layer 14 and the core member 18 by the use of alignment slot 20. Particularly, in this non-limiting embodiment, a "pre-punched" or pre-formed "sighting window" 29 is created in the dielectric material 26. This sighting window 29 may be of virtually any size or shape and is relatively easily and visually aligned with the slotted aperture 20, thereby allowing the dielectric material 26 to be desirably and operatively placed upon the predetermined portions of layer 14 in a desired position and/or location, by the use of a conventional printing process such as a screen printing process or a dry film printing process. Similarly, in this non-limiting embodiment, all other layers of material which are operatively added to the circuit assembly, as shown in the remaining FIGS. 1(d)–1(k), also include such pre-formed sighting windows 29 which allow these respective layers of material to be easily and operatively aligned with layer 14 and member 12 in the manner which is shown and by use of the aperture 20.

The dielectric material 26 is made to fill apertures 25, while creating a first and a second apertures 28, 30 which terminate within and/or upon respectively exposed regions or portions of layer 14. As will be seen below, these apertures 28, 30 are selectively extended and/or lengthened and form "blind" or "non-through hole" type "vias" or apertures in the produced and/or created circuit assembly or board. In one non-limiting embodiment of the invention, the dielectric material 26 is partially cured in order for the material 26 to function and/or to serve as an adhesive in the next step of the process 10. Thus, the third step of process 10 causes pre-circuit assembly 27 to be created.

Figure 1D:
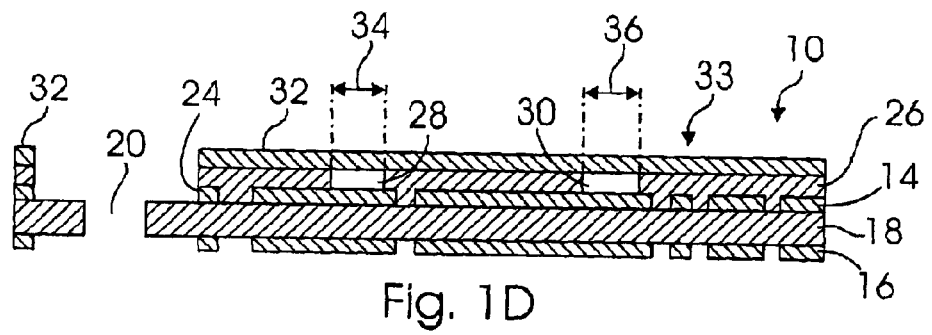

In the fourth step of process 10, which is shown in FIG. 1(d), a third layer of electrically conductive material 32 is operatively and adhesively placed (i.e., laminated) onto the partially cured dielectric material 26 and over the apertures 28, 30, thereby creating a third pre-circuit assembly 33. In one non-limiting embodiment, the third layer of electrically conductive material 32 is formed from conventional and commercially available copper and is substantially identical to the first and second layers 14, 16.

Figure 1E:
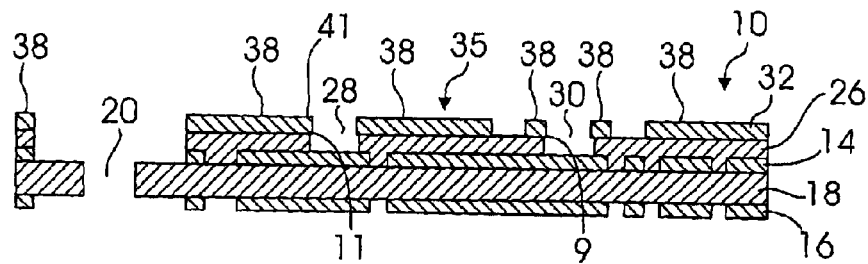

In the fifth step of process 10, which is shown in FIG. 1(e), the portions 34, 36 of layer 32 which respectively reside over the previously created apertures 28, 30 are removed by a conventional etching and removal process. The remaining portions of the third material layer 32 are, in one non-limiting embodiment, coated and/or receive commercially available tin 38 in order to substantially prevent these remaining portions from being further etched, reduced, and/or removed, thereby creating a fourth pre-circuit assembly 35.

Further, in one non-limiting embodiment, the third layer of electrically conductive material 32 serves and/or functions as an electrical ground plane and aperture 37, which is formed in this third layer of electrically conductive material 32, communicates with the previously formed aperture 30 and extends the aperture 30 through the formed pre-circuit assembly. The extended aperture 30 is "disconnected" from electrical ground potential (i.e. the surface boundary 9 which forms and surrounds the aperture 37 and the extended aperture 30 is physically and electrically "disconnected" from the remaining portion of material 32) in order to later allow for the formation of a "non-grounded via" or "non-grounded aperture" in a manner which is delineated below.

Similarly, aperture 39, which is formed in this third layer of electrically conductive material 32, communicates with the previously formed aperture 28 and extends the aperture 28 through the formed pre-circuit assembly. The extended aperture 28 is a "grounded via" or "grounded aperture" since the material boundary 11 which forms or surrounds the extended aperture 28 remains physically and electrically connected to the remaining portions of this third layer of material 32. Extended apertures 28, 30 are each "blind" or "non-through hole" type apertures or openings. In other non-limiting embodiments of the invention, portions of material layer 32 may selectively overlay or "hang over" certain predetermined portions of the apertures 28, 30 in order to cause the created and extended apertures 28, 30 to be formed in a certain desired shape or size. As will be seen later, extended apertures 28, 30 are selectively filled with solder paste or some other material. Hence, in these non-limiting embodiments, the overhanging portions of material layer 32 function as a "lip" or a "diving board" 41 to retain the solder paste or material within the extended apertures 28, 30.

Figure 1F:
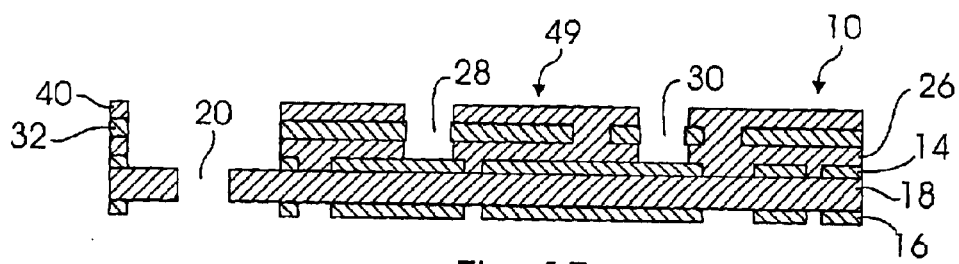
Figure 1G:
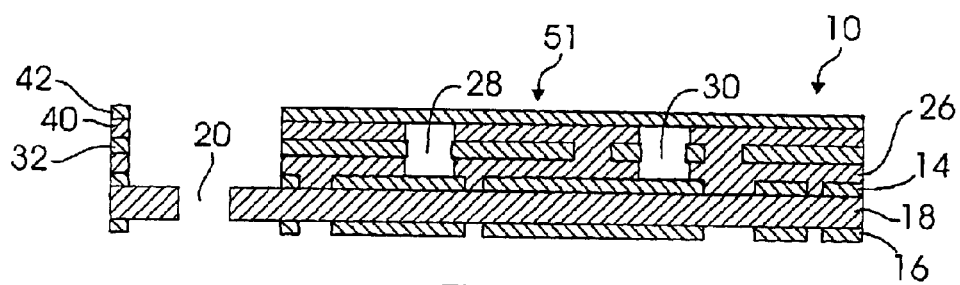

In the sixth step of process 10, as shown best in FIG. 1(f), a fifth pre-circuit assembly 49 is created. Particularly, a second layer of commercially available dielectric material 40 is placed onto the remaining portions of the third layer of electrically conductive material 32 by a conventional printing process, thereby further extending the respective length of apertures 28, 30. The dielectric material 40 may again be partially cured in order to operatively and effectively adhere to a layer of material which it supportively receives. In the seventh step of process 10, as shown best in FIG. 1(g), a fourth layer of electrically conductive material 42 is placed onto and operatively secured to (i.e., laminated onto) the dielectric material 40 and over the extended apertures 28, 30. In one non-limiting embodiment of the invention, material 42 comprises commercially available copper and/or is substantially similar to the first, second, and third layers of electrically conductive material 14, 16, and 32. Hence, a sixth pre-circuit assembly 51 is formed in this seventh process step.

Figure 1H:
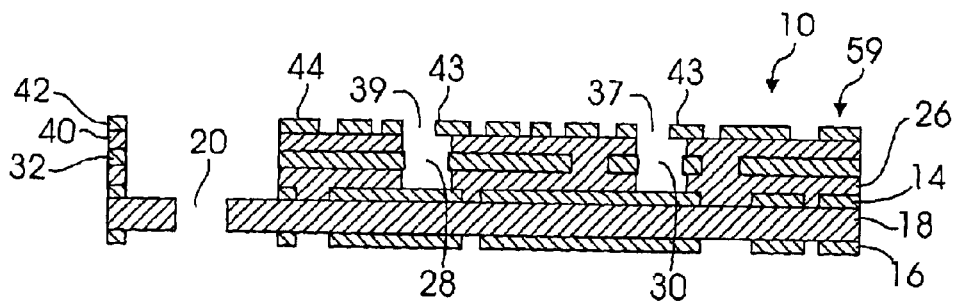

In the eighth step of process 10, as shown best in FIG. 1(h), a seventh pre-circuit assembly 59 is formed. Particularly, portions of the fourth layer of conductive material 42 are removed by a conventional pattern etching and removal process, thereby removing those portions of material 42 which overlay extended apertures 28, 30 and further extending the length of "blind type" apertures 28, 30. As before, some of the layer of material 42, such as "diving board" portion 43, may extend over these recently extended apertures 28, 30 in order to cause the apertures 28, 30 to be formed in a desired shape and/or to substantially ensure that the material which is placed within these apertures 37, 39 remains securely intact. A layer of commercially available tin 44 is, in one non-limiting embodiment, attached to the remaining portions of material 42 in order to prevent these remaining portions from being further etched, removed, and/or reduced.

It should be realized that the additional and alternative layers of a dielectric material and an electrical conductive material may be operatively attached to the pre-circuit assembly 59 in the foregoing manner, thereby increasing the density of the assembly 59 and extending or selectively lengthening "blind type" apertures 28, 30 through these additional layers. Additionally, it should be apparent that this process 10 is adapted to allow a circuit board assembly to be created having a selected number of electrically conductive layers which are each separated by a dielectric material. Hence, while the first eight steps of process 10 allow for the creation of two additional electrically conductive layers 32, 42 upon member 12, additional electrically conductive layers may be selectively utilized and created, thereby allowing a great variety of dissimilar multi-layer electrical circuit boards to be produced by process 10.

Figure 1I:
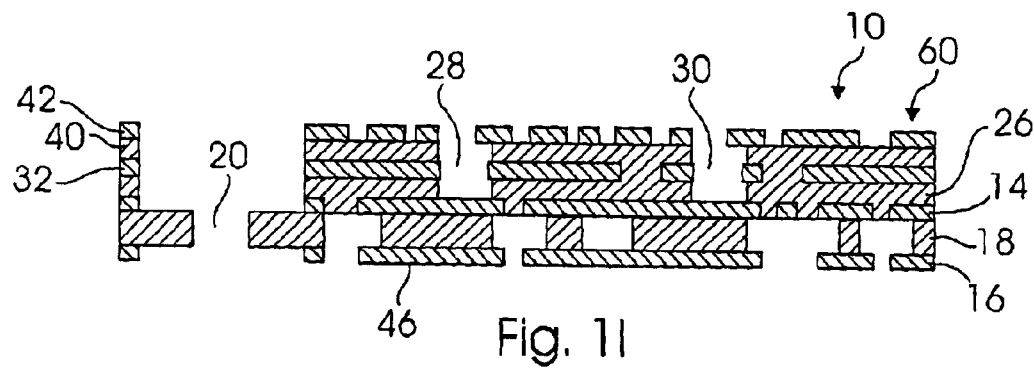

In the ninth step of process 10, as shown best in FIG. 1(i), an eighth pre-circuit assembly 60 is created. Specifically, portions of the central layer 18 are removed by a conventional controlled etching process, thereby creating and/or producing electrically conductive air-bridges 46 within and/or by the use of material layer 16.

Figure 1J:
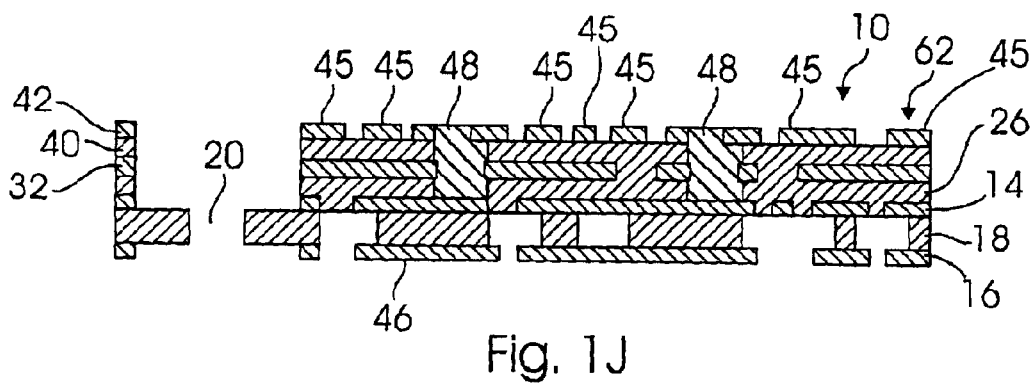

In the tenth step of process 10, which is shown best in FIG. 1(j), a ninth pre-circuit assembly 62 is created by selectively placing commercially available screen print type solder paste 48 within each of the created "vias" or apertures 28, 30. Particularly, as best shown in FIGS. 1(i) and 1(j), "blind" type aperture or "via" 28 begins at and/or within the first conductive layer 14 and extends through the first layer of dielectric material 26, the third layer of conductive material 32, the second layer of dielectric material 40, and the fourth layer of conductive material 42. Similarly, "blind type" aperture or "via" 30 begins at and/or within the first conductive layer 14 and extends through the first layer of dielectric material 26, the third layer of conductive material 32, the second layer of dielectric material 40, and the fourth layer of conductive material 42. It should be realized that in other embodiments of the invention, additional numbers of "vias" 28 or 30 may be selectively created and utilized in the foregoing manner. In other non-limiting embodiments, commercially available copper may be electroplated upon the surface boundaries forming and/or surrounding each of the apertures or "vias" 28, 30. It should also now be realized that, the foregoing etching of layer 42 allows the remaining portions 45 of layer 42, which are not connected to material 48, to become and/or to function as electrically conductive air bridges or crossover circuits.

Figure 1K:
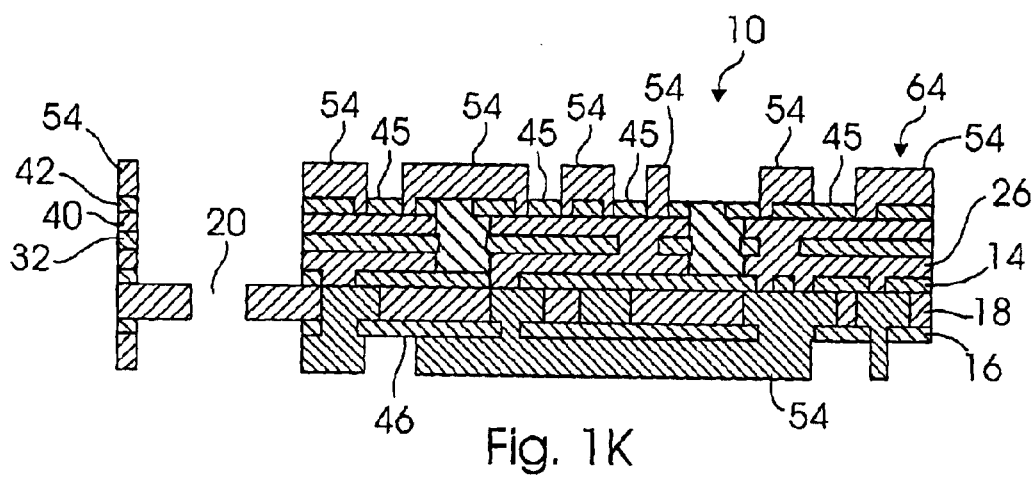

In the eleventh step of process 10, which is best shown in FIG. 1(k), a multi-layer circuit board or assembly 64 is created by applying a conventional acrylic solder masking material 54 to various selected portions of the created air bridges or crossover circuits 45, 46 in order to structurally protect the formed air bridges or crossover circuits 45, 46 from deformation and allowing the formed air bridges or crossover circuits 45, 46 to accommodate relatively heavy wire bonding material and relatively heavy components. As should be known to those of ordinary skill in the art, material 54 may be applied by a conventional screen printing or photo-imaging process.

It should be realized that the previously delineated process 10 allows for the relatively efficient creation of a multi-layer circuit board and/or assembly 64 which is capable of operatively containing a selected number of electrically conductive layers 14, 16, 32, 42 and a selected number of "grounded" and "non-grounded" "vias" or apertures 28, 30 which are formed without drilling. It should be further realized that the foregoing process 10 substantially eliminates and/or reduces the need for costly and time consuming layer alignment procedures and the use of additional adhesive material due to the partial curing of the dielectric material layers 26, 40. It should also be realized that the foregoing process produces "blind type" apertures 28, 30 which contain substantially no aluminum material 18, thereby allowing for the relative efficient flow or use of solder material 48 in these selectively extended apertures 28, 30. Moreover, these filled apertures 28, 30 cooperate with the various material layers 14, 16, 18, 26, 32, 40, and 42 to provide an electrically interconnected circuit board 64 which may be functionally tested (e.g., solder receiving apertures 28, 30 electrically connect the various conducting layers 14, 16, 32, and 42) prior to receiving electrical components. Further, many diverse types and/or shapes of electrical busses may be formed upon and/or within the circuit board 64.

It should be understood that the invention is not limited to the exact embodiment or construction which has been illustrated and described but that various changes may be made without departing from the spirit and the scope of the invention.

What is claimed is:

1. A method for making an electric circuit board comprising the steps of:
   providing a member having a central layer of a first material which is operatively contained between first and second layers of a second material;
   placing a layer of a third material upon certain portions of said first layer, thereby exposing at least one portion of said first layer;
   placing a plurality of layers of said second material on top of said layer of third material, effective to form a multi-layer circuit board having an aperture which extends through said formed circuit board and which terminates upon said exposed at least one portion of said first layer;
   forming at least one slotted aperture through said central layer and through said first and second layers of a second material;
   forming a sighting window within each of said plurality of layers of said second material and forming at least one sighting window within said layer of said third material, said at least one sighting window of said third material being visually aligned with said at least one slotted aperture, thereby allowing said third material to be operatively placed upon predetermined portions of said first layer in a desired position.

2. The method of claim 1 wherein said second material comprises electrically conductive material.

3. The method of claim 2 wherein said second material comprises copper.

4. The method of claim 3 wherein said central layer of material comprises aluminum.

5. The method of claim 4 wherein said third material comprises a dielectric material.

6. The method of claim 1 further comprising the step of forming a registration slot within said member.

7. The method of claim 1 further comprising the step of selectively etching said central layer, effective to form at least one air-bridge.

8. The method of claim 1 further comprising the step of placing solder within said aperture.

9. The method of claim 1 further comprising the step of preventing said central layer from being resident within said aperture.

10. A method for making a circuit board comprising the steps of:
    providing a member having a central layer of a first material which is operatively positioned between top and bottom layers of a second material;
    removing a portion of said top and said bottom layers, thereby exposing portions of said central layer of said first material;
    providing a first layer of a dielectric material and placing said first layer of said dielectric material onto certain portions of said top layer, thereby overlaying said exposed portions of said central layer and creating first and second exposed portions of said top layer;
    providing a third layer of said second material and placing said third layer onto said first layer of said dielectric material and over said first and second exposed portions of said top layer;
    removing those portions of said third layer which overlay said first and said second exposed portions of said top layer;

providing a second layer of said dielectric material and placing said second layer of said dielectric material onto said third layer after those portions of said third layer which overlay said first and second exposed portions of said top layer have been removed;

providing a fourth layer of said second material and placing said fourth layer upon said second layer of said dielectric material, and over said first and second exposed portions of said top layer; and removing those portions of said fourth layer which overlay said first and said second exposed portions of said top layer, thereby creating an electrical circuit board having a first aperture which extends through said third and fourth layers of said second material and through said first and second layers of said dielectric material while terminating within said first layer of said second materials, and a second aperture which extends through said third and fourth layers of said second material and through said first and second layers of said dielectric material while terminating within said first layer of said second material.

11. The method of claim 10 wherein said first material comprises aluminum.

12. The method of claim 11 wherein said second material comprises copper.

13. The method of claim 10 wherein said first aperture is electrically grounded.

14. The method of claim 13 wherein said second aperture is isolated from electrical ground.

15. The method or 10 further comprising the step of placing solder within said first and second apertures.

16. The method of claim 10 further comprising the step of forming a diving board over at least one of said first and second apertures.

* * * * *